US007242223B1

(12) United States Patent
Alon

(10) Patent No.: US 7,242,223 B1
(45) Date of Patent: Jul. 10, 2007

(54) CLOCK FREQUENCY MONITOR

(75) Inventor: Moshe Alon, Herzlia (IL)

(73) Assignee: National Semiconductor Corporation, Santa Clara, CA (US)

( * ) Notice: Subject to any disclaimer, the term of this patent is extended or adjusted under 35 U.S.C. 154(b) by 49 days.

(21) Appl. No.: 10/797,478

(22) Filed: Mar. 10, 2004

Related U.S. Application Data

(60) Provisional application No. 60/453,395, filed on Mar. 10, 2003.

(51) Int. Cl.
*H03K 9/06* (2006.01)

(52) U.S. Cl. .......................... 327/39; 327/40; 327/42; 327/47; 327/48

(58) Field of Classification Search .................... None
See application file for complete search history.

(56) References Cited

U.S. PATENT DOCUMENTS

| | | | | | |
|---|---|---|---|---|---|
| 4,352,999 | A | * | 10/1982 | Galpin | 327/79 |
| 4,380,733 | A | * | 4/1983 | Yano et al. | 324/166 |
| 5,418,409 | A | * | 5/1995 | Kuhn | 327/78 |
| 5,488,323 | A | * | 1/1996 | Beacham et al. | 327/74 |
| 5,497,110 | A | * | 3/1996 | Smith | 327/42 |
| 6,008,671 | A | * | 12/1999 | Kang | 327/20 |
| 6,281,699 | B1 | * | 8/2001 | Bishop | 324/765 |
| 6,289,055 | B1 | * | 9/2001 | Knotz | 375/286 |
| 6,542,013 | B1 | * | 4/2003 | Volk et al. | 327/115 |
| 6,667,638 | B1 | * | 12/2003 | Kramer et al. | 327/115 |
| 6,998,882 | B1 | * | 2/2006 | Chung | 327/115 |

* cited by examiner

*Primary Examiner*—Timothy P. Callahan
*Assistant Examiner*—An T. Luu

(57) ABSTRACT

A frequency monitor circuit (FMC) that is part of an integrated circuit chip for monitoring the frequency of one or more clocks present on the chip is disclosed. The FMC includes a reference window generator, operative to output a reference window signal of a given duration, and a clock counter, operative to count all pulses, in any one of the clocks, that occur within the duration of the reference window and to output a corresponding pulse count. The FMC further includes two or more comparators, each operative to compare the pulse count with a respective given threshold value and to output a corresponding indication of frequency deviation. In one configuration, in which the clock is generated on the chip by a frequency multiplier, the reference window generator and the clock counter are shared between the frequency monitor circuit and the frequency multiplier.

28 Claims, 2 Drawing Sheets

CLOCK FREQUENCY MONITOR

CROSS-REFERENCE TO RELATED APPLICATIONS

This patent application claims priority to U.S. Provisional Patent Application Ser. No. 60/453,395 filed on Mar. 10, 2003 entitled “CLOCK FREQUENCY MONITOR.”

FIELD OF THE INVENTION

This invention relates to clock signals in digital systems and, in particular, to a semiconductor circuit for monitoring the frequencies of such clock signals.

BACKGROUND OF THE INVENTION

Digital systems and modules are ubiquitous, serving for a variety of purposes, including data processing, communication and control. In the context of the present specification, a digital system or module may be any of a wide range of sizes and packages, from a single semiconductor chip, through a multiple chip board or module to an assembly of boards or modules. Any of these may form a part of a more general system, such as an electronic system, an electrical power system, an appliance, a vehicle, etc.

Typically a clock signal is provided within the digital system to which various other signals are synchronized or from which they are derived. A clock signal typically consists of a train of pulses at a constant frequency. In the following description a clock signal will be simply referred to as a clock. Often there are provided within a system one or more additional clocks, generated independently of the first clock, although in many cases they are related to, derived from, or synchronized with, the first clock. Any of the clocks may be generated, by respective clock generators, within the system under consideration or outside it.

Usually the first clock has a highly stable frequency and is therefore often called a reference clock, while the other clocks, referred to as ancillary clocks, are generated in a manner that causes their respective frequencies to be inherently less stable. Often, the frequency of an ancillary clock is much higher than that of the reference clock. Typically, a high frequency ancillary clock is generated under some relation to the reference clock. Two well known means for such generation are the Phase Locked Loop (PLL) and the Frequency Multiplier (Fmul).

Due to various causes, the frequency of an ancillary clock may not always be stable, even if the clock is generated in synchrony with the reference clock. This is particularly true for frequencies much higher than that of the reference clock. Two particular effects are often noticeable in synchronous types of clock generators: (1) short-term fluctuations, namely those occurring between moments of synchronization, and (2) inherent drift. The meaning of inherent drift is that the frequency tends to drift away from its nominal value and is kept at that value only by the effect of the synchronization. If the tendency to drift becomes strong enough, the situation may become unstable and the synchronization may become ineffective or erroneous.

It is often desirable to detect frequency drift tendencies before they cause drastic effects. In other cases it is often desirable to detect frequency deviations exceeding certain given threshold values. The need for such detection may arise during production of chips that contain ancillary clock generators, for example, in order to possibly control production parameters or to reject a chip when unacceptable frequency deviations have been detected. A need for such detection may similarly arise during normal usage of the digital system, for example, in order to warn of an actual or impending malfunction due to frequency deviations. For the case of detection during production, it is further desirable that the means for detection be provided on the same chip as the clock generator under consideration, thus avoiding the need for a special test setup.

U.S. Pat. No. 5,633,609 to Duncan discloses an internal monitor circuitry that detects whether a clock signal is present at its input. The circuit does not, however, detect the frequency of the clock signal, nor any deviations of the frequency from a given value. U.S. Pat. No. 5,497,110 to Smith discloses a frequency monitor and error detector circuit that compares an input alternating current (ac) signal with a reference frequency, which is much higher than that of the alternating current (ac) signal. The times of zero transitions of the alternating current (ac) signal are compared with those of the nearest cycles of the reference frequency in order to yield a measure of frequency deviation, which is processed in a logic circuit to obtain a go/no-go decision.

The circuitry of the Smith patent includes an inherently analog circuit and is thus not very suitable for realization on a digital integrated circuit (IC) chip. Furthermore, the Smith patent is directed to electric power frequencies and is not suitable for the high frequencies prevalent in modern digital systems, to which the present invention is directed. Moreover, the circuitry of the Smith patent is relatively complex and thus may not be economical.

Therefore there is a need in the art for a compact on-chip digital circuit for monitoring the frequency of any clock present on the integrated circuit chip.

SUMMARY OF THE INVENTION

The present invention comprises a frequency monitor circuit (FMC) that is part of an integrated circuit chip, there being provided on the chip at least one clock, whose frequency is to be monitored, each of the clocks being a respective monitored clock. The FMC comprises:

a reference window generator (RWG), operative to output a reference window signal, the reference window having a given duration;

a monitored clock counter (MCC), responsive to the reference window signal and to any one of the monitored clocks and operative to count all pulses in the respective monitored clock that occur within the duration of the reference window and to output a corresponding pulse count; and at least two comparators, responsive to the pulse count, each comparator being operative to compare the pulse count with a respective given threshold value and to output a corresponding indication of frequency deviation.

In one advantageous embodiment of the invention the FMC further comprises a storage and logic module (SLM), responsive to outputs of the comparators, wherein the RWG, MCC and comparators are operative to function repeatedly and the SLM is operative to store any indication output by the comparators, the stored indications being available for readout. The SLM may be further operative to process the stored indications to obtain statistical information about the frequency of any of the monitored clocks, including an indication of a trend in frequency deviation.

In one advantageous embodiment of the FMC of the present invention the chip comprises at least one clock generator and the output of any of the generators is one of the monitored clocks. The clock generator may include a PLL or it may be a frequency multiplier. In the latter case, the RWG and the MCC may form part of the frequency multiplier.

In another advantageous embodiment of the FMC of the present invention there is further provided on the chip a reference clock, and the RWG comprises a reference clock counter (RCC) that is responsive to the reference clock and operative to count a given number of reference clock pulses, wherein the beginning of the reference window coincides with the beginning of the counting and the end of the reference window coincides with the end of the counting. In one configuration of this advantageous embodiment, the chip includes a clock generator of the frequency multiplier type, whose output is a monitored clock, the RCC and the MCC form part of the clock generator.

According to another advantageous embodiment of the invention, the FMC further comprises a selector, receptive to a plurality of monitored clocks and operative to switch any one of them into the MCC. Further, when the chip forms part of a digital system, some of the monitored clocks may be generated, within the system, outside the chip.

The foregoing has outlined rather broadly the features and technical advantages of the present invention so that those skilled in the art may better understand the detailed description of the invention that follows. Additional features and advantages of the invention will be described hereinafter that form the subject of the claims of the invention.

Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

In order to understand the invention and to see how it may be carried out in practice, an advantageous embodiment pf the invention will now be described, by way of non-limiting example only, with reference to the accompanying drawings, in which.

DETAILED DESCRIPTION OF THE INVENTION

Figure 1A:
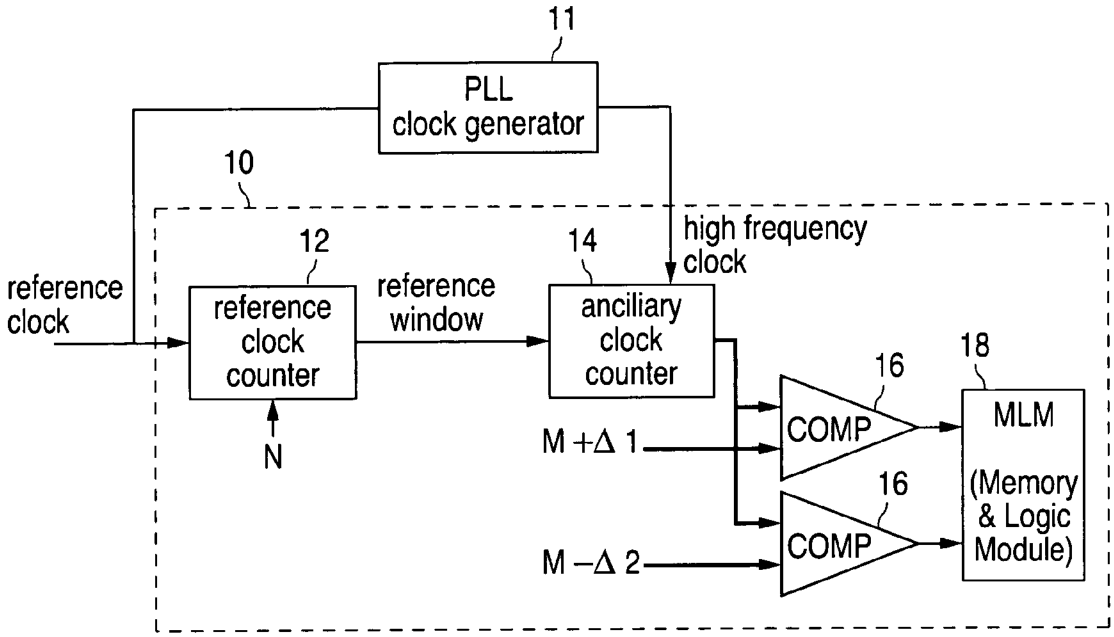
FIG. 1A illustrates a block diagram of an advantageous embodiment of the frequency monitor of the invention in a configuration that is suitable for monitoring an on-chip phase locked loop (PLL) clock generator.

FIG. 1A illustrates a block diagram that represents an advantageous embodiment of a clock frequency monitor (CFM) 10 in accordance with the principles of the invention. This embodiment is configured to monitor the frequency of a high frequency clock generator 11 that is phase locked to a reference clock by means of a Phase Locked Loop (PLL) that is well known in the art. For convenience clock generator 11 will simply be referred to as PLL 11. Preferably both CFM 10 and PLL 11 are integrated circuits (ICs). More preferably, CFM 10 is built into the same integrated circuit (IC) chip as PLL 11.

CFM 10 is seen to basically consist of a reference clock counter (RCC) 12, an ancillary clock counter (ACC) 14, two comparators 16 and a Memory & Logic Module (MLM) 18, all interconnected as shown in FIG. 1A. RCC 12 receives a reference clock that is provided within the chip. This clock may be the same reference clock that is fed to PLL 11 or it may be a different one. The RCC also receives a window count N (to be explained more fully below). ACC 14 receives the high frequency clock, output by PLL 11, which clock is to be monitored.

Comparators 16 receive, as comparison values, some given threshold values, representing corresponding acceptable limits for frequency deviation. The actual threshold values may be expressed as a nominal count M in the ACC (to be explained more fully below), corresponding to the nominal PLL output frequency, plus or minus, respectively, some given delta, representing the maximum acceptable frequency deviation. The absolute values of the two deltas need not be equal.

In operation, RCC 12 counts a number of successive reference clock pulses equal to the given window count N. The duration of this counting (equal to N times the duration of one cycle of the reference clock) is noted as a reference window and a signal corresponding to the reference window is sent from the RCC 12 to ACC 14. This signal may, for example, be in the form of a pulse, whose duration (or width) is exactly that of the reference window, or, as another example, it may be in the form of a pair of very short pulses—one at the beginning of the reference window and one at its end.

ACC 14 counts up pulses in the ancillary clock, received from PLL 11, over the duration of a reference window and outputs the resultant count into comparators 16. When the frequency of the PLL 11 output is at its nominal value, the count output by the ACC 14 has a certain nominal value M. It is clear that the ratio M/N is exactly equal to the ratio between the nominal PLL clock frequency and the reference clock frequency. The count value obtained from ACC 14 is compared in each comparator 16 with a respective threshold value.

As noted above, a high threshold value, input to one of the comparators (referred to as the upper threshold comparator) is equal to the nominal count value M plus a delta value. Similarly, a low threshold value, input to the other comparator (referred to as the lower threshold comparator) is equal to the nominal count value N minus a delta value. If the count from the ACC 14 is between the two threshold values (signifying that the PLL frequency is close to its nominal value), the output of each comparator 16 remains at its "normal" level. If the count exceeds the higher threshold level (signifying that the PLL frequency deviates upward from its nominal value by more than a given amount, corresponding to an upper threshold), the corresponding upper threshold comparator changes its output to a suitably indicative level.

Similarly, if the count is lower than the lower threshold level (signifying that the PLL frequency deviates downward from its nominal value by more than a given amount, corresponding to a lower threshold), the corresponding lower threshold comparator changes its output to a suitably indicative level. The outputs of comparators 16, which thus indicate excessive frequency deviation, may be fed directly to an indication device or to some suitable control circuit for taking an appropriate action. In the illustrated advantageous embodiment, though, the outputs of comparators 16 are fed to MLM 18 for further processing (to be explained more fully below).

It is to be appreciated that a clock generator of any other type may appear in place of PLL 11 and the CFM 10 of FIG. 1A may then equally serve to monitor its output. Such a clock generator, moreover, may not necessarily have a reference clock as an input.

In an alternative, more general, embodiment of the CFM 10 of the invention (not shown), the RCC 12 is replaced by a reference window generator (RWG) that operates not necessarily by counting supplied reference clock pulses, yet similarly outputs a reference window signal as described above. It may, for example, include an internal crystal-based oscillator. It may thus be particularly suitable for the case that no reference clock is present on the chip. In this general case, the variable N should be interpreted as representing a window width in some suitable units.

The operations of generating a reference window, counting ancillary clock pulses and comparing the count with threshold values, forming together one measurement cycle, are preferably repeated at some regular interval, thus providing a time series of measurement results, some of which may indicate excessive frequency deviations. These results are input to MLM 18 and stored in suitable memory registers therein. A logic circuit within MLM 18 is designed, or programmed, to perform certain statistical operations on the stored indications. These operations may include any of a variety of possible statistical calculations, including, but not limited to, finding averages, variances, peaks and short-term trends. The statistical variables to be calculated may depend on the expected causes of frequency deviations, on the expected nature of the deviations (e.g., whether they are characterized by slow drifts, by random fluctuations, by consistent inaccuracies or by an irreversible change) and on what deviations may be detrimental to the operation of the system or (in the case of in-production testing) the chip.

A very simple yet useful operation that may be performed in the MLM 18 is, for example, to just store any indication of excessive frequency deviation. The stored information may be polled from time to time by an agent external to the chip. Another relatively simple type of operation that may be performed in the MLM is, for example, to detect whether any two consecutive measurement cycles result in a similar excessive deviation indication (i.e., whether both indicate exceeding the upper threshold or going below the lower threshold).

It is to be appreciated that the number of comparators 16 may, in alternative configurations, be greater than two. Each comparator would then be fed a different threshold count. For example, there may be three comparators, two of which will be fed threshold counts less than the nominal count M by two respective delta values, so that their respective outputs indicate two levels of frequency deviation.

It is also to be appreciated that comparators 16 could be replaced by any other logic circuit that would effect the desired comparisons and output corresponding deviation indications. For example, and in particular, a subtraction circuit may be used in which any threshold value is subtracted from the count values in order to obtain deviation values of variable magnitude. The term "comparator" should be understood herein to include any such circuit and the term "comparing" to also include subtracting. It should further be appreciated that threshold values, input as described above, may be represented by other given values (e.g., the nominal count M and suitable delta values).

Figure 1B:
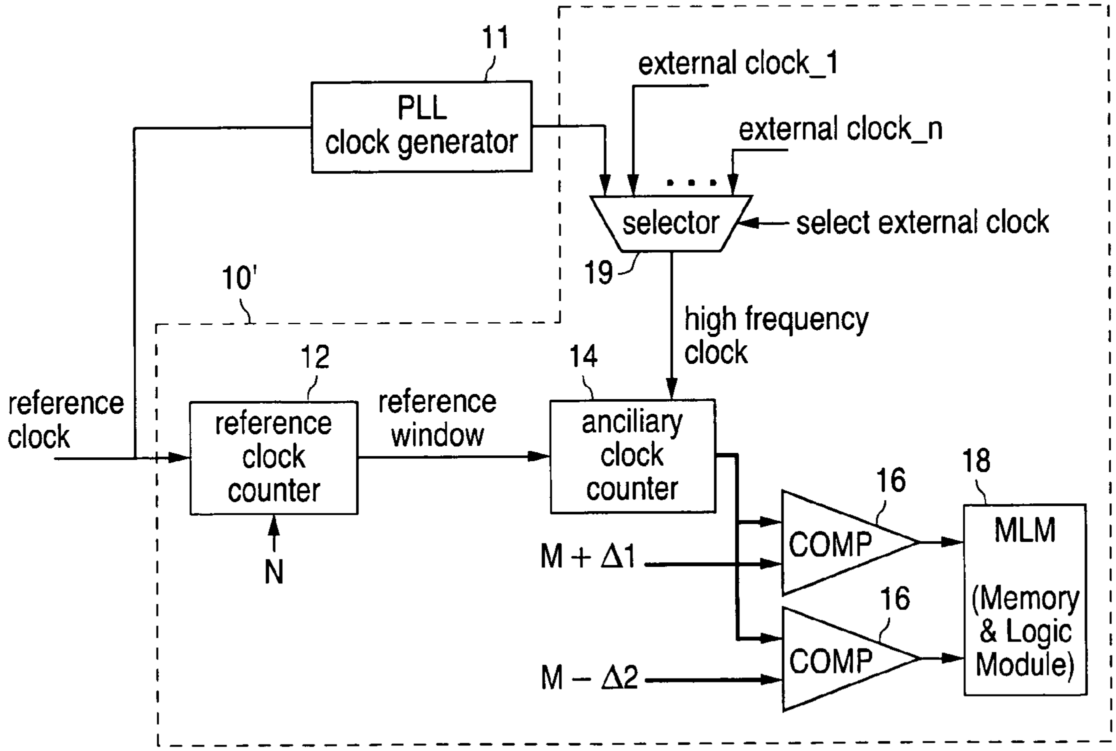
FIG. 1B illustrates a block diagram of a variation of the advantageous embodiment that is shown in FIG. 1A that is also suitable for monitoring external clocks.

FIG. 1B illustrates a block diagram that represents a variation of the CFM configuration shown in FIG. 1A. The CFM 10' here is seen to be similar to that of FIG. 1A except that it comprises, in addition, an ancillary clock selector 19, having a plurality of clock input ports and one clock output port. Under the control of a selection signal, selector 19 is operative to switch a clock at any one of the input ports into the output port. One of the clocks input to selector 19 is that output from PLL 11. The other one or more clocks, denoted by "external clock_1" etc., may be obtained from elsewhere in the digital system. Any of these may be generated on the same chip that includes the CFM, for example, by another PLL clock generator, or by clock generators elsewhere in the system, outside the chip. The clock output by selector 19 is input to ACC 14 to be treated there in the same manner as the PLL clock in the configuration shown in FIG. 1A.

In operation, a selection signal is applied to selector 19 to select a particular one of the input ancillary clocks (including that from PLL 11) and to switch it to its output, and therefore to the input of ACC 14. At the same time a suitable window count (or window width) value N is applied to RCC 12 and suitable threshold values (related to a nominal count value M) are applied respectively to comparators 16. The operation then proceeds similarly to the operation that has been described above with respect to FIG. 1A, possibly including multiple repetitions of the measurement cycle, to obtain corresponding excessive frequency deviation indications at the output of comparators 16, and possibly also corresponding statistical variable values, at the output of MLM 18.

The operation may then be repeated with a different selection signal and corresponding values of window count and of thresholds. The operation may be thus repeated for all input clocks, possibly in a cyclical sequence. The value of N, as well as the threshold values (which are akin to the nominal frequency value M), may generally differ for the various ancillary clocks being monitored. When the CFM includes a RCC, the ratio M/N is usually made proportional to the ratio of the nominal ancillary clock frequency to the reference clock frequency.

It is to be noted that the advantageous embodiment shown in FIG. 1B is economical in that it uses a single CFM to monitor the frequencies of a plurality of clocks (and the operation of a plurality of clock generators) whether on the same chip or elsewhere in the digital system. It is to be appreciated that the clock generators that are to be monitored may be of any type and that, moreover, PLL 11 in FIG. 1A and in FIG. 1B represents only an exemplary type of a clock generator and that any other type could be connected to the CFM circuits and monitored in much the same manner as described above.

Figure 2:
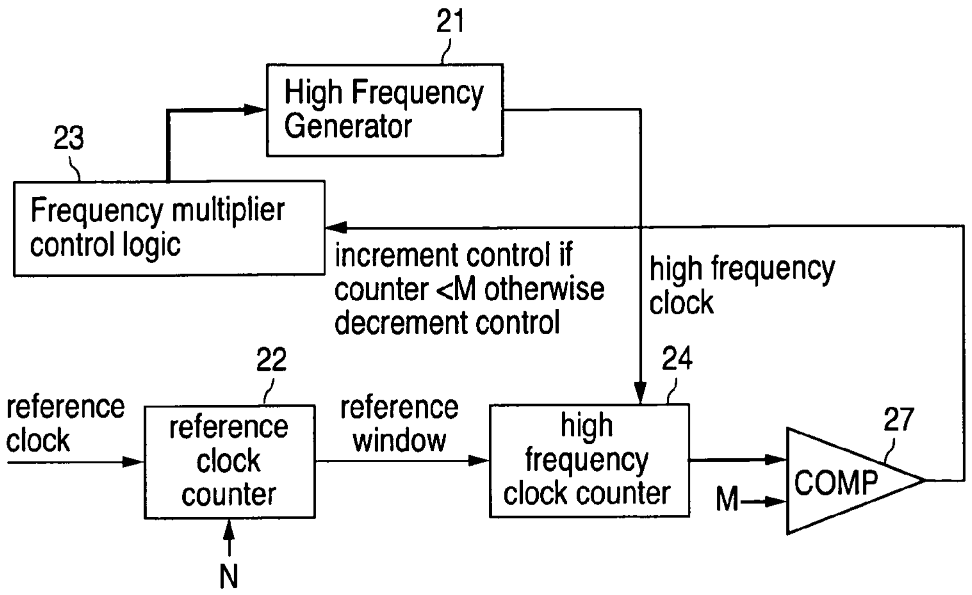
FIG. 2 (PRIOR ART)
FIG. 2 illustrates a block diagram of a prior art frequency-multiplier type of clock generator.

FIG. 2 illustrates a block diagram that represents a typical prior art frequency multiplier (Fmul) type of a clock generator. It comprises a high frequency pulse train generator (HFPG) 21, a frequency control logic 23, a reference clock counter (RCC) 22, a high-frequency clock counter (HFCC) 24 and a comparator 27, all interconnected as shown in FIG. 2. RCC 22 receives a reference clock and a window count value N. Comparator 27 receives, as a comparison value, a nominal high frequency count value M. In operation, RCC 22 counts a number of successive reference clock pulses equal to the given window count N and outputs a reference window signal over the duration of this counting. The reference window signal is applied to HFCC 24, which counts successive pulses in the high frequency clock, output by HFPG 21, over the duration of the reference window. The count from the HFCC is applied to comparator 27 which compares it with M. As a result, the comparator outputs a by-level signal indicating whether the count exceeds M or is less than M. This signal is applied to frequency control logic 23 which accordingly corrects the frequency control value that it continuously sends to HFPG 21. This operational cycle is repeated indefinitely.

It is to be noted that in the operation of the Fmul of FIG. 2 there are no threshold values involved and that any correction in the frequency control value is incremental, namely up or down a given number (usually one) of units, in correspondence with the binary value of the comparator's output. If the frequency of the clock, output by HFPG 21, is stable and at its nominal value, the control value will oscillate between two corresponding levels. If, however, that frequency at some time deviates appreciably from its nominal value, it may take a series of measurement cycles and corresponding corrective changes in the control value (all being in the same sense) to coerce the generated frequency back to the nominal value. This situation exemplifies one possible malfunction of the Fmul that needs monitoring.

Another possible type of malfunction of the Fmul is a constant tendency of the frequency inherently generated by the HFPG to slowly drift in one of the two senses (e.g., upwards). In such a case the control mechanism would keep the frequency of the clock, actually output, near the nominal value as long as the drift is within a certain range, but beyond that it will fail. An early detection of this tendency is therefore desirable.

Yet another type of possible malfunction, for which monitoring is desirable, is associated with the control mechanism in the HFPG. The control value obtained from control logic 23 is transmitted as a digital signal and is converted within HFPG 21 to an analog signal by means of a digital-to-analog converter (D/A). Inherent inaccuracies in the D/A may cause the differences between certain adjacent value levels to be different from others, thus possibly causing appreciable jumps in the frequency during the correction process.

Figure 3:
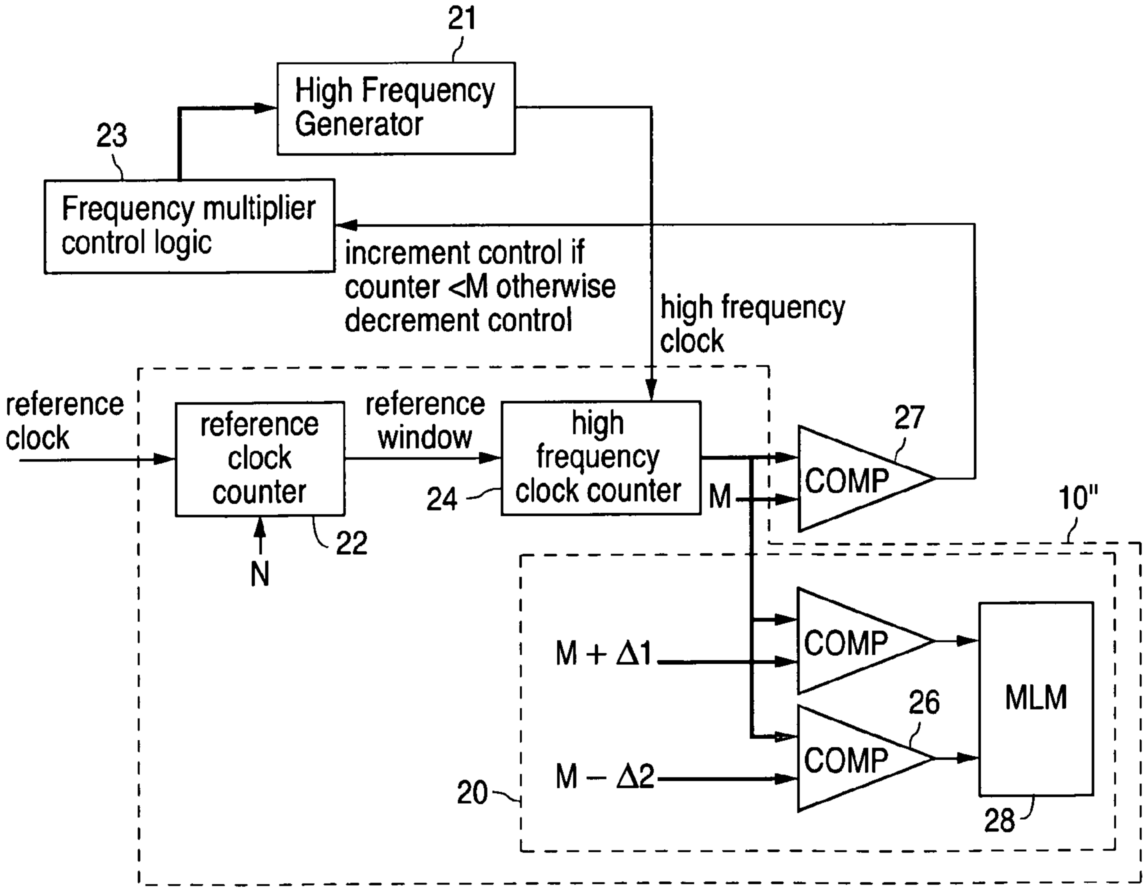
FIG. 3 illustrates a block diagram of an advantageous embodiment of the frequency monitor of the invention in a configuration that is suitable for on-chip monitoring the Fmul clock generator shown in FIG. 2.

FIG. 3 illustrates a block diagram that represents an advantageous embodiment of the CFM of the invention that is configured to monitor a frequency-multiplier clock generator (Fmul) of the type shown in FIG. 2 and discussed above. The components of the Fmul that are exactly the same as in FIG. 2 are indicated by the same reference numerals. Two of these components, namely RCC 22 and HFCC 24, also serve as components of the CFM 10". Additional components of the CFM, enclosed by dashed rectangle 20, are two comparators 26 and, in the illustrated advantageous embodiment, Memory & Logic Module (MLM) 28.

RCC 22, HFCC 24, comparators 26 and MLM 28 are analogous to, and their operation is similar to, RCC 12, ACC 14, comparators 16 and MLM 18, respectively, of FIG. 1A, as explained above. Also overall operation of the CFM is similar to that described above, except that the RCC and the HFCC, forming also part of the Fmul, operate in a continuously repeating cycle, whereas the analogous components in the configuration of FIG. 1A, as well as all the other components of the CFM, may operate intermittently, as required by the application. Optionally, an output of MLM 28 may in some cases be applied to frequency control logic 23, so as to more tightly control frequency correction, based on the statistical processing in the MLM.

It is to be noted that the sharing of the RCC and the HFCC between the Fmul and the CFM is economical and makes the application of the CFM of the invention particularly advantageous for monitoring clock generators of the Fmul type. It is to be appreciated that, similar to the advantageous embodiment shown in FIG. 1A (as well as that shown in FIG. 1B), the number of comparators 26 in the advantageous embodiment of FIG. 3 may be greater than two. The advantageous embodiment of FIG. 3 may be modified, by adding a selector, interposed in the path of the high frequency clock to HFCC 24, similar to selector 19 in FIG. 1B.

Here, again, the selector would be fed additional clocks as inputs, which clocks may come from other ancillary clock generators on the chip, not necessarily of the Fmul type, or from sources external to the chip. Monitoring of these other clocks would be effected by occasionally switching the selector to receive any of the other inputs (thus interrupting the control loop of the Fmul), feeding a corresponding N value to RCC 22 and corresponding threshold values to comparators 26 and reading resultant output from MLM 28.

Although the present invention has been described with respect to a number of exemplary embodiments, various changes and modifications may be suggested to one skilled in the art. It is intended that the present invention encompass such changes and modifications as fall within the scope of the appended claims.

What is claimed is:

1. A frequency monitor circuit (FMC) configured to receive at least one monitored clock whose frequency is to be monitored, said FMC comprising:

a reference window generator (RWG) operative to output a reference window signal defining a reference window, the reference window having a given duration;

a monitored clock counter (MCC) operative to count all pulses any one of the at least one monitored clock that occur within the duration of said reference window and to output a corresponding pulse count; and at least two comparators, each comparator operative to compare said pulse count with a respective given threshold value and to output a corresponding indication of frequency deviation.

2. The frequency monitor circuit of claim 1, further comprising a storage and logic module (SLM), wherein said RWG, said MCC and said comparators are operative to function repeatedly and the SLM is operative to store one or more indications output by the comparators, the one or more stored indications being available for readout.

3. The frequency monitor circuit of claim 2, wherein said SLM is further operative to process the stored indications so as to obtain statistical information about the frequency of any of the at least one monitored clock.

4. The frequency monitor circuit of claim 3, wherein said statistical information includes indication of a trend in frequency deviation.

5. The frequency monitor circuit of claim 1, formed on an integrated circuit chip that includes at least one clock generator, an output of any of said at least one clock generator being one of the at least one monitored clock.

6. The frequency monitor circuit of claim 5, wherein said at least one clock generator comprises a phased locked loop (PLL).

7. The frequency monitor circuit of claim 5, wherein said at least one clock generator is a frequency multiplier.

8. The frequency monitor circuit of claim 7, wherein said RWG and said MCC form part of said frequency multiplier.

9. The frequency monitor circuit of claim 1, wherein said RWG includes a reference clock counter (RCC) operative to count a given number of reference clock pulses in a reference clock, and wherein a beginning of said reference window coincides with a beginning of said counting and an end of said reference window coincides with an end of said counting.

10. The frequency monitor circuit of claim 9, wherein an integrated circuit chip includes a clock generator of a frequency multiplier type, whose output is a monitored clock, wherein said RCC and said MCC form part of said clock generator.

11. The frequency monitor circuit of claim 1, wherein said at least one clock is at least two clocks, the FMC further comprising a selector operative to switch any one of the at least two clocks into said MCC.

12. The frequency monitor circuit of claim 11, formed on an integrated circuit chip that forms part of a digital system and at least one of the monitored clocks is input to the chip.

13. The frequency monitor circuit of claim 11, wherein the duration of said reference window is different for each monitored clock.

14. The frequency monitor circuit of claim 11, wherein, for any of said comparators, the respective threshold value is different for each monitored clock.

15. An integrated circuit chip, on which there is provided at least one monitored clock whose frequency is to be monitored, the chip comprising a frequency monitor circuit (FMC) that includes:

a reference window generator (RWG) operative to output a reference window signal defining a reference window, the reference window having a given duration;

a monitored clock counter (MCC) operative to count all pulses in any one of the at least one monitored clock that occur within the duration of said reference window and to output a corresponding pulse count; and at least two comparators, each comparator operative to compare said pulse count with a respective given threshold value and to output a corresponding indication of frequency deviation.

16. The integrated circuit chip of claim 15, wherein said FMC further includes a storage and logic module (SLM), wherein said RWG, said MCC and said comparators are operative to function periodically and the SLM is operative to store one or more indications output by the comparators, the one or more stored indications being available for readout.

17. The integrated circuit chip of claim 16, wherein said SLM is further operative to process the one or more stored indications to obtain statistical information about the frequency of any of the at least one monitored clock.

18. The integrated circuit chip of claim 17, wherein said statistical information includes indication of a trend in frequency deviation.

19. The integrated circuit chip of claim 15, further including at least one clock generator and wherein an output of any of said at least one clock generator is one of the at least one monitored clock.

20. The integrated circuit chip of claim 19, wherein said at least one clock generator includes a phase locked loop (PLL).

21. The integrated circuit chip of claim 19, wherein said at least one clock generator is a frequency multiplier.

22. The integrated circuit chip of claim 21, wherein said RWG and said MCC form part of said frequency multiplier.

23. The integrated circuit chip of claim 15, wherein there is further provided on the chip a reference clock, wherein said RWG includes a reference clock counter (RCC) operative to count a given number of reference clock pulses, and wherein a beginning of said reference window coincides with a beginning of said counting and an end of said reference window coincides with an end of said counting.

24. The integrated circuit chip of claim 23, further including a clock generator of a frequency multiplier type, whose output is a monitored clock, wherein said RCC and said MCC form part of said clock generator.

25. The integrated circuit chip of claim 15, wherein said at least one clock is at least two clocks, the FMC further comprising a selector operative to switch any one of the at least two clocks into the MCC.

26. The integrated circuit chip of claim 25, the chip forming part of a digital system and at least one of the monitored clocks being generated, within the system, outside the chip.

27. The integrated circuit chip of claim 25, wherein the duration of said reference window is different for each monitored clock.

28. The integrated circuit chip of claim 25, wherein, for any of said comparators, the respective threshold value is different for each monitored clock.

* * * * *